United States Patent [19]

Arai

[11] Patent Number: 5,022,059

[45] Date of Patent: Jun. 4, 1991

[54] COUNTER CIRCUIT PRESETTABLE WITH A PLURALITY OF COUNT VALUES

[75] Inventor: Tomohisa Arai, Tokyo, Japan

[73] Assignee: NEC Corporation, Tokyo, Japan

[21] Appl. No.: 380,173

[22] Filed: Jul. 13, 1989

[30] Foreign Application Priority Data

Jul. 13, 1988 [JP] Japan .............................. 63-175803
Sep. 20, 1988 [JP] Japan .............................. 63-237018

[51] Int. Cl.⁵ .............................................. H03K 21/02
[52] U.S. Cl. .......................................... 377/39; 377/54; 377/52
[58] Field of Search ............................ 377/39, 54, 52

[56] References Cited

U.S. PATENT DOCUMENTS

| | | | |
|---|---|---|---|
| 3,621,403 | 11/1971 | Seiy ........................................ | 377/39 |
| 3,924,078 | 12/1975 | Bussey ................................... | 377/39 |
| 4,757,464 | 7/1988 | Zimmermann et al. .............. | 377/39 |
| 4,795,984 | 1/1989 | Janssen .................................. | 377/39 |
| 4,805,199 | 2/1989 | Muramatsu ........................... | 377/39 |

*Primary Examiner*—John S. Heyman
*Attorney, Agent, or Firm*—Helfgott & Karas

[57] ABSTRACT

Disclosed herein is a counter circuit which includes a register for temporarily storing a count data signal, a data processing circuit coupled to the register and supplied with a control signal for producing a first count value from the count data signal in response to a first state of the control signal and for producing a second count value from the count data signal in response to a second state of the control signal, and a counter stage coupled to the data processing circuit and supplied with an input signal to be counted for producing a detection signal when the input signal to be counted is supplied thereto by a time number determined by the first or second count value.

9 Claims, 4 Drawing Sheets

COUNTER CIRCUIT PRESETTABLE WITH A PLURALITY OF COUNT VALUES

BACKGROUND OF THE INVENTION

The present invention relates to a counter circuit and, more particularly, to a counter circuit for outputting a detection signal when an input signal to be counted occurs a plurality of times at which the count of the input signal becomes at a count value.

Such a counter circuit is composed, in general, of a register temporarily storing a count value of the predetermined time and a counter stage counting the input signal to the count value inputted from the register to produce the detection signal. As the count stage, there are known two types, one of which employs a down-counter and the other of which employs an up-counter. In the counter stage employing the down-counter, the count value from the register is preset into the down-counter in response to an initial signal and the count value of the down-counter is decremented one by one each time the count signal is applied. When the count value of the down-counter becomes zero, the detection signal is produced therefrom. In the counter stage employing the up-counter, on the other hand, the up-counter is reset to zero in response to the initial signal and the count value of the up counter is incremented one by one each time the count signal is applied. When the count value of the up-counter reaches the count value which is set by the register, the detection signal is produced.

However, the above conventional counter circuit has a drawback that the occurrence time number of the input signal to produce the detection signal cannot be controlled so long as the register stores the same count value. In other words, the count value to be stored into the register should be changed each time the counter circuit starts to count for producing the detection signal in different occurrence time number of the input signal.

SUMMARY OF THE INVENTION

Therefore, an object of the present invention is to provide an improved counter circuit.

Another object of the present invention is to provide a counter circuit presettable with a plural number of count values from one data signal involving the count values.

Still another object of the present invention is to provide a counter circuit in which an occurrence time number to produce a detection signal can be changed without restoring the data signal involving the count values.

A counter circuit according to the present invention comprises a register for temporarily storing a data signal involving information of count values, a data processing circuit coupled to the register for receiving a count value control signal for producing a first count value from the data signal when the count value control signal assumes a first state and a second count value from the data signal when the count value control signal assumes a second state, and a counter stage coupled to the data processing circuit for receiving an input signal to be counted for producing a detection signal every times at which the number of the input signal reaches the first or second count value.

Thus, only by controlling the state of the count value control signal, the count number of the input signal of the counter stage can be changed without restoring the data signal into the register.

It is convenient to employ a mask circuit as the data processing circuit. When the count value control signal assumes the first state, the mask circuit masks at least one bit of the registered data signal to produce the first count value. In case where the count value control signal is in the second state, on the other hand, at least another bit of the registered data signal is masked by the mask circuit to produce the second count value. The counter stage may employ either a down-counter or an up-counter.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
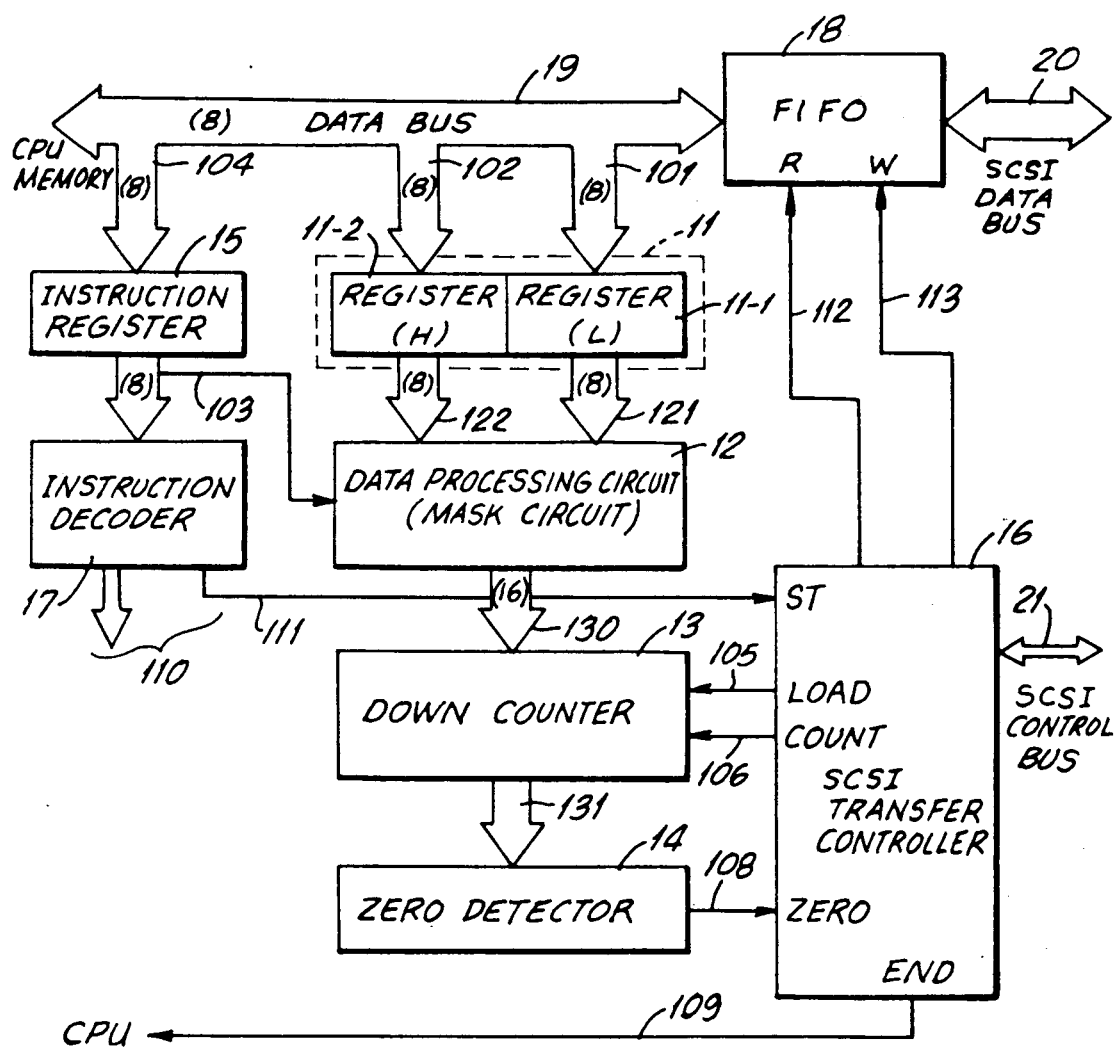
FIG. 1 is a block diagram representative of an SCSI (Small Computer System Interface) controller employing a counter circuit according to a first embodiment of the present invention.

Referring to FIG. 1, a counter circuit according to a first embodiment of the present invention is equipped for a small computer system interface (SCSI) controller. A reference numeral 11 denotes a register temporarily storing a data signal involving two information of count values and composed of a lower register 11-1 and a higher register 11-2; 12 denotes a data processing circuit for performing a data processing operation on the output data from the register 11; 13 denotes a down counter presettable with a count value, 14 denotes a zero detector for detecting that the count value of the down-counter 13 is zero; 15 denotes an instruction register for storing a command or instruction to be executed; 17 denotes an instruction decoder for decoding the command from the register 15; 16 denotes an SCSI transfer controller for controlling a data transfer on an SCSI bus 20; and 18 denotes a FIFO (First-In First-Out) memory provided between the SCSI bus 20 and a system data bus 19. The data bus 19 is connected to the registers 11 and 15 and further to a CPU, a data memory, etc. (not shown in the drawing). Moreover, each of reference numerals 101, 102 and 103 denotes a branch bus from the data bus 19; 103 denotes a count value control signal which is produced from the command stored in the instruction register 15; 105 denotes a count value load signal to be supplied to the down-counter 13 from the controller 16, 106 denotes a count signal (i.e., a signal to be counted) which is generated each time the controller 16 performs one byte data transfer operation on the SCSI bus 20; and 108 denotes a zero detection signal which is generated when the count value of the counter 13 is zero and supplied to the controller 16. When the controller 16 receives the zero detection signal 108, it supplies a transfer completion signal 109 to the CPU. The decoder 17 decodes the command from the instruction register 15 and produces a set of operation control signals 110, one of which is supplied to the controller 16 as a transfer start signal 111. The controller 16 controls a magnetic disk controller or a optical disk controller (not shown) by use of an SCSI control bus 21 and produces data read and write signals 112 and 113 to perform a data transfer operation by use of the data bus 19, FIFO memory 18 and SCSI data bus 20.

Figure 2:
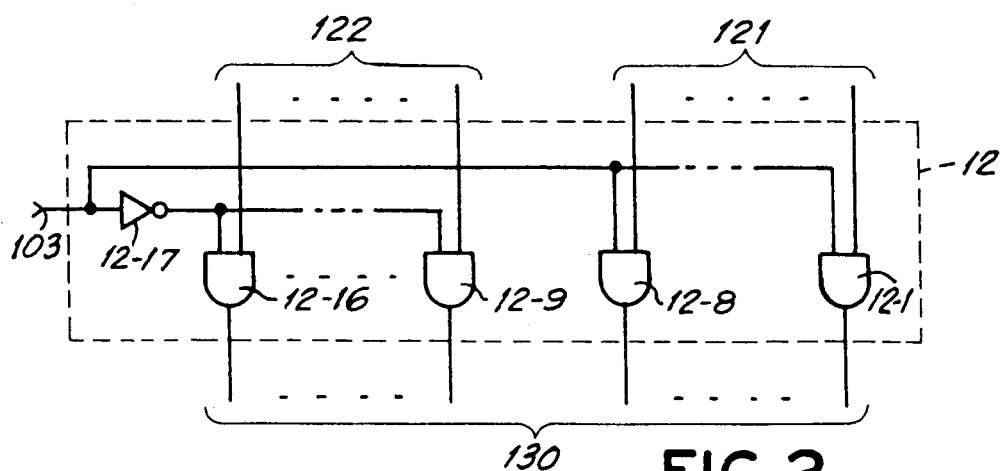
FIG. 2 is a circuit diagram representative of a data processing circuit shown in FIG. 1.

Referring to FIG. 2, the data processing circuit 12 includes one inverter 12-17 and sixteen AND gates 12-1 to 12-16 (only four AND gates 12-1, 12-8, 12-9 and 12-16 being shown to avoid the complexity of the drawing). The AND gates 12-1 to 12-8 receive eight bits data 121 from the lower register 11-1 and the AND gates 12-9 to 12-16 receives eight bits data 122 from the higher register 11-2, the open and closed states thereof being controlled by the signal 103. The outputs of the AND gates 12-1 to 12-16 are derived as 16-bit count value data 130. Accordingly, the data processing circuit 12 operates as a mask circuit which masks the data 122 from the higher register 11-2 to zero when the count value control signal 103 assumes logic "1" and masks the data 121 from the lower register 11-1 to zero when the signal 103 assumes logic "0".

Figure 3:
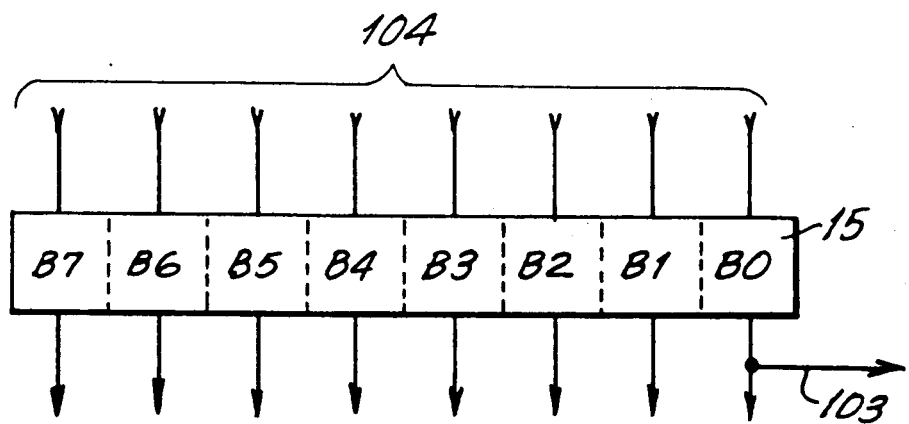
FIG. 3 is a circuit diagram representative of an instruction register shown in FIG. 1.

Referring to FIG. 3, the instruction (or command) register 15 is composed of eight bits $B_0$ to $B_7$, the data of the least significant bit $B_0$ of which is led out as the count value control signal 103. That is, the logic level of the control value control signal 103 is controlled by the least significant bit of the command stored in the register 15.

Operation will be described below with reference to FIGS. 1 to 3. In the SCSI, the transfer of the commands of 6 to 12 bytes and the transfer of the data of integer times of 256 bytes are preformed continuously. It is assumed in the present description that the 6-byte, command and 1024-byte data are transferred.

The CPU (i.e. host processor) writes at first 1024+6=1030, i.e. "0406H" in hexadecimal notation, into the count data register 11 via the system data bus 19. Since the data bus 19 is an 8-bit width, a value of "06H" is written into the lower register 11-1 and thereafter a value of "04H" is written into the higher register 11-2. Subsequently, the CPU writes a command indicative of the SCSI command transfer into the instruction register 15 via the system data bus 19 and the branch bus 104. The least significant bit $B_0$ of this command is logic "1". Therefore, the count value control signal 103 assumes logic "1", so that the data processing circuit (mask circuit) 12 masks the 8-bit data from the higher register 11-2 to zero. The count value data 130 from the circuit 12 thereby takes a value of "0006H". On the other hand, the decoder 17 decodes the command from the register 15 and produces the transfer activation signal 103, so that the SCSI transfer controller 16 starts to operate. At first, the controller 16 outputs the count value load signal 105 to the down counter 13. In response thereto, the counter 13 is loaded with the count value of "0006H". Thereafter, the controller 16 performs the SCSI command transfer operation and outputs the count signal 106 each time one byte command is transferred. The down counter decrements the count value thereof by one in response to the count signal 106.

By the completion of the transfer of 6-byte commands, the counter 131 produce a zero count value onto a count bus 131, so that the zero detector 14 produces the detection signal 108. In response thereto, the controller 16 stops the command transfer and outputs the transfer completion signal 109 to inform the CPU that the SCSI command transfer is completed.

In response to the signal 109, the CPU writes a new command indicative of the SCSI data transfer into the instruction register 15 via the buses 19 and 104. The least significant bit $B_0$ of this command is logic "0". Accordingly, the count value control signal 103 is changed to logic "0", so that the mask circuit 12 masks the 8-bit data from the lower register 11-1 to zero. As a result, the count value data on the bus 130 takes a value of "0400H". On the other hand, the transfer start signal 111 is again produced by the decoder 17. In response thereto, the controller outputs the count value load signal 105. The down-counter 13 is thereby loaded with the value of "0400H". The controller 16 performs the SCSI data transfer by use of the FIFO memory 18 and outputs the count signal 106 each time one byte data is transferred. In response to the signal 106, the counter 13 decrements the count value thereof by one. By the data transfer of 1024-byte, the count value of the counter 13 becomes to be zero, and the zero detector 14 produces the detection signal 108. In response thereto, the controller stops the data transfer operation and outputs signal 109 to inform the CPU that the SCSI data transfer of 1024-byte is completed.

Thus, the set of the count data to the register 11 is sufficient only once and, without rewriting the count data, the detection signal 108 can be produced in response to the 6-time occurrence of the count signal 106 and 1024-time occurrence of the count signal 106, respectively.

Figure 4:
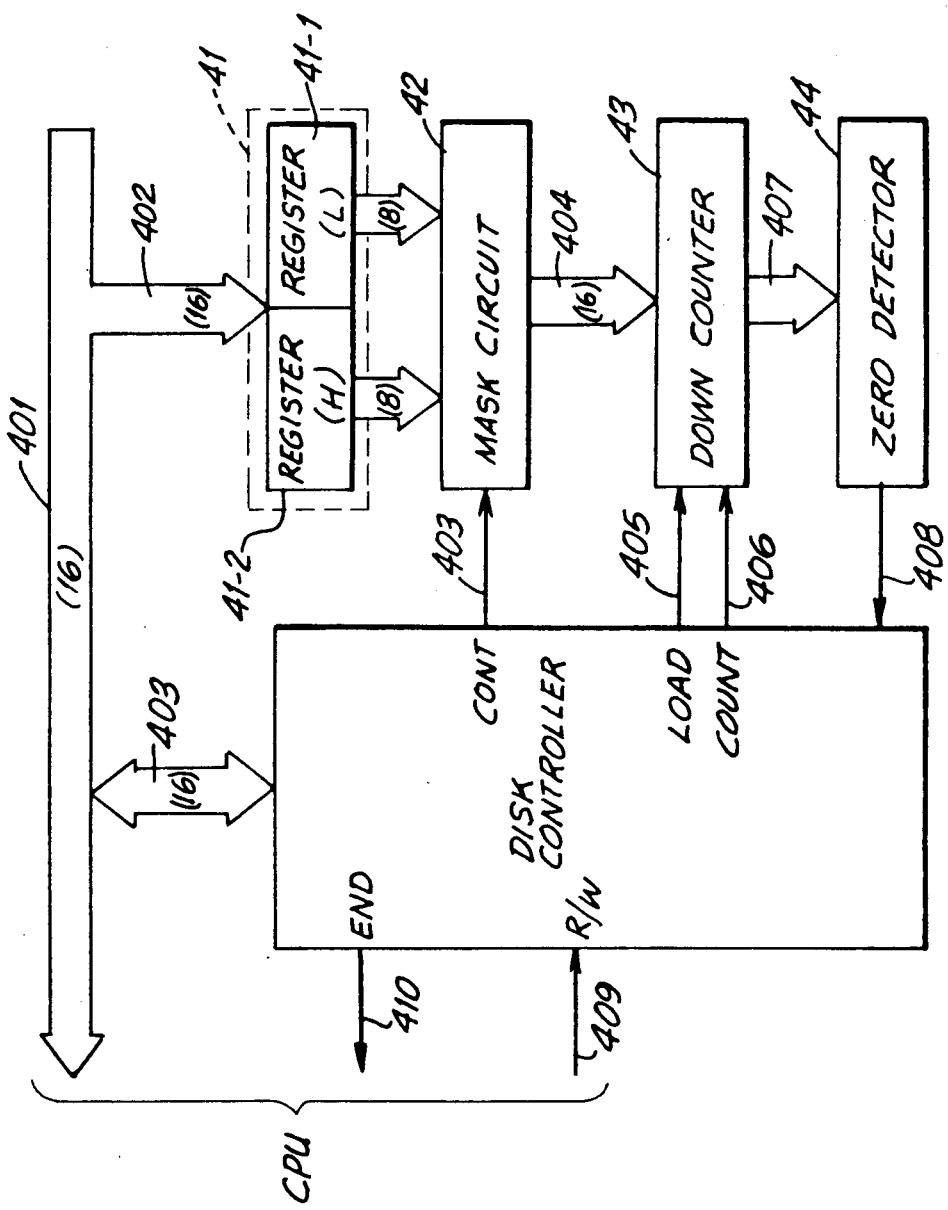
FIG. 4 is a block diagram representative of a disk controller as a second embodiment of the present invention.

Referring to FIG. 4, a counter circuit according to a second embodiment of the present invention is used for a data read/write control in a disk controller, wherein a reference numeral 41 denotes a register temporarily storing count data and composed of a lower register 41-1 and a higher register 41-2; 42 denotes a mask circuit selectively masking the output data from the register 11; 43 denotes a down-counter presettable with a count value; 44 denotes a zero detector detecting that the count value of the counter 43 becomes zero; and 45 denotes a disk controller. Further, each of reference numerals 401, 402, 404, 407 denotes a data bus of a 16-bit width; 403 denotes a count value control signal to the mask circuit 42; 405 denotes a load signal indicative of the loading of the count value to the counter 43; 406 denotes a count signal generated each time one-byte data is transferred; 408 denotes a detection signal from the detector 44; 409 denotes a start indication signal for a data read/write operation; and 410 denotes an end indication signal of a data read/write operation.

In a data read/write control of a disk, the controller 45 reads ID code of 4 to 5 bytes from the disk to seek an objective sector and thereafter performs a data read/write operation on data of integer times of 256 bytes. It is assumed in the present description that a sector defined by 4-byte ID code is sought and 512-byte data are thereafter read from the disk continuously.

The CPU writes at first count data, 512+4=516 ("0204H" in hexadecimal notation), into the register 41 via the data bus 401. The lower register 41-1 stores the data of "04H" and the higher register 41-2 stores the data of "02H". Thereafter, the CPU changes the start indication signal 409 to an active level, so that the disk controller starts to operate.

The controller 45 changes the count value control signal 403 to an inactive level (logic "1" in this embodiment). Therefore, the mask circuit 42 mask the 8-bit data from the higher register 41-2 to zero, so that count value data of "0004H" is outputted onto the data bus 404. Thereafter, the controller 45 outputs the load signal 405, so that the down counter 43 is loaded with the data of "0004H" as a count value. The controller 45 then starts to detect the address mask of the ID code part. When the ID code part is found, the read operation of the ID code part is started and the count signal 406 is produced each time one-byte code is read out. In response to the count signal 406, the down-counter 43 decrements the count value thereof by one. When the count value of the counter 43 becomes zero, the zero detector 44 produces the detection signal 408. In response to the signal 408, the controller 45 judges whether or not the objective sector is sought from the read-out ID codes. In the case where the objective sector is not sought, the above-mentioned sector seeking operation is repeated.

When the objective sector is sought, the controller 45 changes the count value control signal 405 to an active level (logic "0"), so that the mask circuit 42 masks the 8-bit data from the lower register 41-1 to zero. The data of "0200H" is thereby outputted onto the bus 404. The controller 45 changes again the load signal 405 to an active level, so that the counter 43 is loaded with the count value data of "0200H". The controller 45 starts to search the address mark of the data part. When the data part is found, the data read operation is started. The count signal 406 is produced each time one-byte data is read out. In response to the signal 406, the counter 43 decrements the count value thereof by one. When the 512-byte data are read out, the count value of the counter 43 becomes zero, so that the detector 44 produces the detection signal 408. In response to the signal 408, the controller 45 outputs the end signal 410 to inform the CPU that the read operation of 512-byte data from the objective sector is completed.

Also in this embodiment, the occurrence time number of the count signal 406 to produce the detection signal 408 can be changed without rewriting the count data into the count data register 41.

Figure 5:
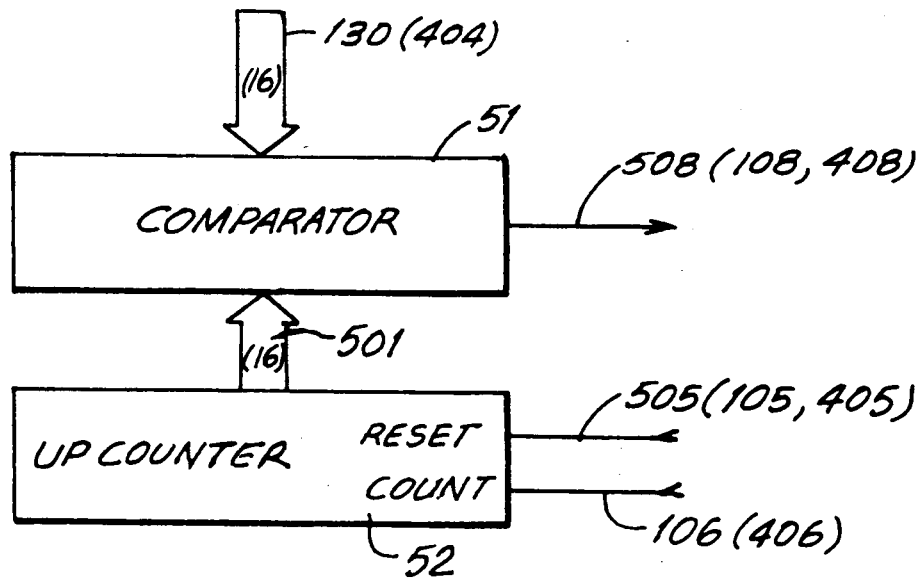
FIG. 5 is a block diagram of a circuit performing the same operation as the circuit composed of a down counter and a zero detector shown in FIGS. 1 and 4.

In the above-described embodiments, an up-counter can be employed in place of the down-counter 13 or 44. The circuit construction for this purpose is shown in FIG. 5. An up-counter 52 receives the count value load signal 105 or 405 as a reset signal 505 and resets to zero by the application of the signal 505. The counter 52 counts up one by one each time the count signal 106 or 406 is supplied thereto and the count value thereof is supplied via a 16-bit data bus 501 to a first set of input terminals of a comparator 51. A second set of input terminals thereof is supplied with the count value from the mask circuit 12 or 42 via the 16-bit data bus 130 or 404. When the count value of the up-counter 52 becomes to be coincident with the count value of the mask circuit 12 or 42, the comparator 51 produces a coincident detection signal 508. Thus, this signal 503 has the same function as the detection signal 108 or 408.

Figure 6:
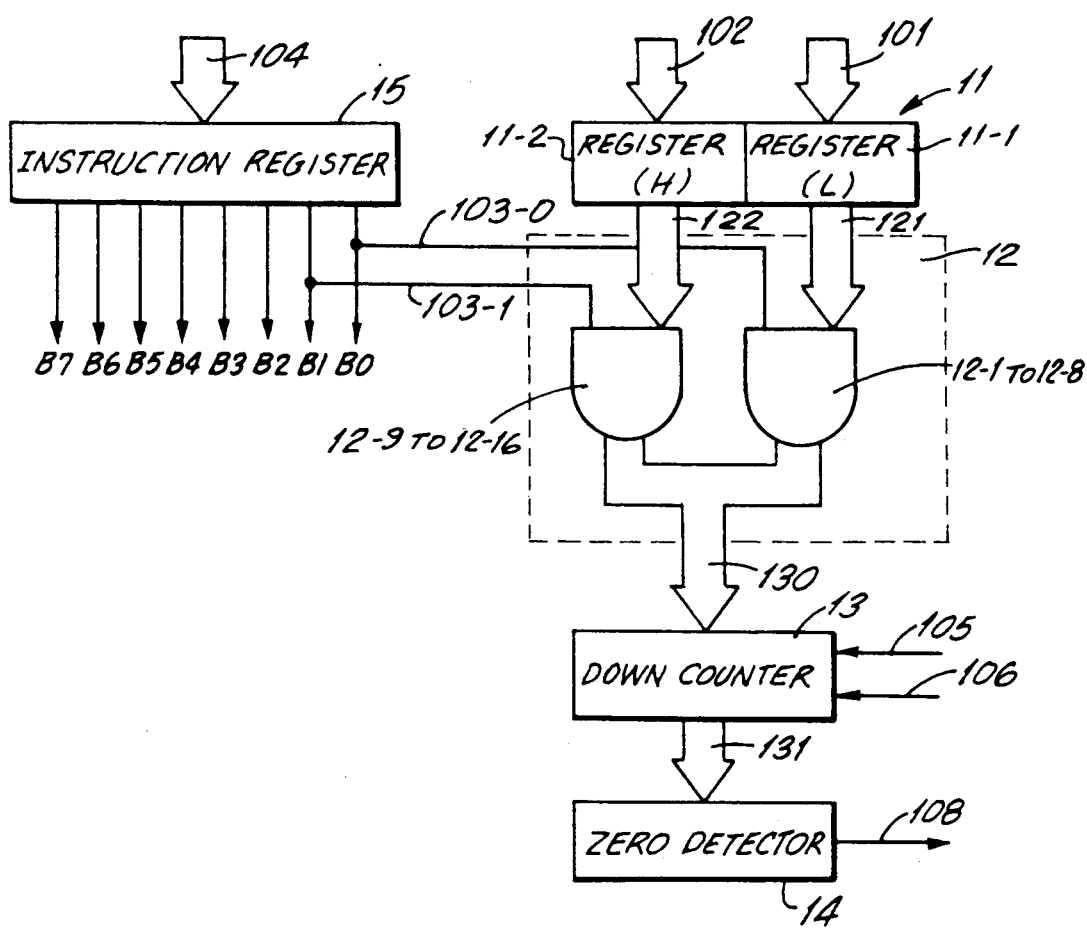
FIG. 6 is a block diagram representative of a third embodiment of the present invention.

Referring to FIG. 6, there is shown a third embodiment of the present invention, in which the same constituents as those shown in FIG. 1 are denoted by the same reference numerals to omit the further description thereof. In this embodiment, the least significant bit B0 and the next bit B1 thereto of the command stored in the instruction register 15 are led out as first and second count value control signals 103-0 and 103-1. The signal 103-0 controls the mask AND gates 12-1 to 12-8 and the signal 103-1 controls the mask AND gates 12-9 to 12-16. When the data of bits B0 and B1 are "1" and "0", respectively, the data from the higher register 11-2 is masked to zero, and when the bits B0 and B1 are "0" and "1", respectively, the data from the lower register 11-1 are masked to zero. In case where both of the bits B0 and B1 are "1", both of the data from the registers 11-1 and 11-2 are not masked and supplied to the counter 13 as they are. Thus, without rewriting the count data into the register 11, the occurrence time number of the count signal 106 to produce the detection signal 108 can be changed three times. The counter circuit according to this embodiment can be applied to the disk controller shown in FIG. 4. The up-counter and comparator shown in FIG. 5 can be applied to the circuit shown in FIG. 6.

The present invention is not limited to the above embodiments, but may be modified and changed without departing from the scope and spirit of the invention.

What is claimed is:

1. A counter circuit comprising storage means for temporarily storing a count data signal having information on a plurality of count values, a first terminal supplied with a count value control signal, data processing means coupled to said storage means and said first terminal for producing first count value data from said count data signal when said count value control signal assumes a first state and for producing second count value data from said count data signal when said count value control signal assumes a second state, a second terminal supplied with an input signal to be counted, counter means coupled to said data processing means and said second terminal for producing a detection signal when an occurrence time number of said input signal reaches said first or second count value data produced by said data processing means, a utilization circuit coupled to said counter means for utilizing said detection signal, a register for temporarily storing command data for controlling said utilization circuit, said command data consisting of a plurality of bits, and means coupled to said register and said first terminal for supplying said count value control signal to said first terminal in response to a predetermined bit of said command data.

2. A counter circuit comprising storage means for temporarily storing a count data signal having information on a plurality of count values, a first terminal supplied with a count value control signal, data processing means coupled to said storage means and said first terminal for producing first count value data from said count data signal when said count value control signal assumes a first state and for producing second count value data from said count data signal when said count value control signal assumes a second state, a second terminal supplied with an input signal to be counted, and counter means coupled to said data processing means and said second terminal for producing a detection signal when an occurrence time number of said input signal reaches said first or second count value data produced by said data processing means, said data processing means masking at least one bit of said count data signal to produce said first count value data and masking at least one other bit of said count data signal to produce said second count value data.

3. The counter circuit as claimed in claim 2, wherein said counter means includes a down-counter preset with said first or second count value data and counting down in response to said signal to be counted and a detector circuit producing said detection circuit when a count value of said down-counter reaches zero.

4. The counter circuit as claimed in claim 2, wherein said counter means includes an up-dounter counting up in response to said signal to be counted and a comparator producing said detection signal when a count value of said up-counter reaches said first or second count value data.

5. A counter circuit comprising a register for temporarily storing a count data signal having information on first and second count values, count data changing means coupled to said register and supplied with a control signal for changing said count data signal to a first data signal in accordance with said first count value when said control signal takes a first state and for changing said count data signal to a second data signal in accordance with said second count value when said control signal takes a second state, counter means coupled to said changing means and loaded with said first or second data signal for decrementing a count value thereof from said first or second count value in response to a signal to be counted, signal producing means coupled to said counter means for producing a detection signal when the count value of said counter means reaches a predetermined value, and circuit means coupled to said count data changing means, said counter means and said signal producing means for supplying said signal to be counted to said counter means with supplying said control signal of said first state to said count data changing means to cause said counter means to be loaded with said first data signal and, when being supplied with said detection signal from said signal producing means, for supplying said signal to be counted to said counter means with changing said control signal from said first state to said second state to cause said counter means to be loaded with said second data signal.

6. A counter circuit comprising a register for temporarily storing count data signal having information on first and second count values, count data changing means coupled to said register and supplied with a control signal for changing said count data signal to a first data signal in accordance with said first count value when said control signal takes a first state and for changing said count data signal to a second data signal in accordance with said second count value when said control signal takes a second state, counter means coupled to said count data changing means and loaded with said first or second data signal for decrementing a count value thereof from said first or second count value in response to an input signal to be counted, and signal producing means coupled to said counter means for producing a detection signal when the count value of said counter means reaches a predetermined value, said count data changing means including first and second mask gate circuits, said first mask gate circuit responding to said first state of said control signal to mask first predetermined bit or bits data of said count data signal and said second mask gate circuit responding to said second state of said control signal to mask second predetermined bit or bits data of said count data signal.

7. A counter circuit comprising a register for temporarily storing count data signal having information on first and second count values, count data changing means coupled to said register and supplied with a control signal for changing said count data signal to a first data signal in accordance with said first count value in response to a first state of said control signal and for changing said count data signal to a second data signal in accordance with said second count value in response to a second state of said control signal, counter means for incrementing a count value thereof in response to a signal to be counted, signal producing means coupled to said changing means and said counter means for producing a detection signal when the count value of said counter means reaches a predetermined value relative to said first or second value, and circuit means coupled to said count data changing means, said counter means and said signal producing means for supplying said signal to be counted to said counter means with supplying said control signal of said first state to said count data changing means and, when being supplied with said detection signal from said signal producing means, for supplying said signal to be counted to said counter means with changing said control signal from said first state to said second state.

8. A counter circuit comprising a register for temporarily storing count data signal having information on first and second count values, count data changing means coupled to said register and supplied with a control signal for changing said count data signal to a first data signal in accordance with said first count value in response to a first state of said control signal and for changing said count data signal to a second data signal in accordance with said second count value in response to a second state of said control signal, counter means for incrementing a count value thereof in response to an input signal to be counted, and detection signal producing means coupled to said count data changing means and said counter means for producing a detection signal when the count value of said counter means reaches a predetermined value relative to said first or second count value, said count data changing means including a mask gate circuit masking a first part of said count data signal in response to said first state of said control signal and masking a second part of said count data signal in response to said second state of said control signal.

9. A counter circuit comprising a register for temporarily storing first count value data, a mask circuit coupled to said register and supplied with a control signal for masking a first part of said first count value data to produce second count value data when said control signal assumes a first logic level and for masking a second part of said first count value data to produce third count value data when said control signal assumes a second logic level, and means coupled to said mask circuit and supplied with a signal to be counted for producing a detection signal when said signal to be counted supplied thereto by a time number determined by said first or second count value data produced from said mask circuit.

* * * * *